US008837188B1

United States Patent
Krishnamurthy et al.

(10) Patent No.: US 8,837,188 B1
(45) Date of Patent: *Sep. 16, 2014

(54) CONTENT ADDRESSABLE MEMORY ROW HAVING VIRTUAL GROUND AND CHARGE SHARING

(75) Inventors: Ganesh Krishnamurthy, Bangalore (IN); Dimitri Argyres, San Jose, CA (US)

(73) Assignee: Netlogic Microsystems, Inc., Irvine, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 13/167,552

(22) Filed: Jun. 23, 2011

(51) Int. Cl.
*G11C 15/00* (2006.01)
*G11C 15/04* (2006.01)
*G11C 11/56* (2006.01)

(52) U.S. Cl.
CPC .............. *G11C 15/04* (2013.01); *G11C 15/00* (2013.01); *G11C 15/046* (2013.01); *G11C 11/56* (2013.01)
USPC ...................... 365/49.1; 365/49.16; 365/49.17

(58) Field of Classification Search
CPC ...... G11C 15/04; G11C 15/00; G11C 15/046; G11C 11/56; G06F 17/30985; G06F 17/30982; G06F 12/0895; G06F 7/02; H04L 45/7457
USPC ................... 365/49.1, 49.16, 49.17
See application file for complete search history.

(56) References Cited

U.S. PATENT DOCUMENTS

| | | | |
|---|---|---|---|
| 3,665,422 A | 5/1972 | McCoy et al. | |
| 4,112,502 A | 9/1978 | Scheuneman | |
| 4,747,080 A | 5/1988 | Yamada | |
| 4,779,226 A | 10/1988 | Haraszti | |
| 4,791,606 A | 12/1988 | Threewitt et al. | |
| 4,831,585 A | 5/1989 | Wade et al. | |
| 4,903,268 A | 2/1990 | Hidaka et al. | |
| 4,958,352 A | 9/1990 | Noguchi et al. | |
| 4,991,136 A | 2/1991 | Mihara | |
| 5,046,046 A | 9/1991 | Sweha et al. | |
| 5,073,727 A | 12/1991 | Shizu | |
| 5,127,014 A | 6/1992 | Raynham | |
| 5,184,325 A | 2/1993 | Lipovski | |
| 5,233,614 A | 8/1993 | Singh | |
| 5,311,462 A | 5/1994 | Wells | |
| 5,319,589 A | 6/1994 | Yamagata et al. | |
| 5,319,590 A | 6/1994 | Montoye | |

(Continued)

OTHER PUBLICATIONS

Application Note AN-94 "Error Detection and Correction with IDT49C466", released by Integrated Device Technology, Inc., pp. 131-141, (1996).

(Continued)

*Primary Examiner* — Fernando Hidalgo
(74) *Attorney, Agent, or Firm* — Sterne, Kessler, Goldstein & Fox P.L.L.C.

(57) ABSTRACT

A content addressable memory (CAM) row is disclosed. The CAM row includes one or more compare circuits coupled between a match line and a virtual-ground line. The compare circuits are configured to compare a search key with CAM cell data words. The CAM row also includes a pre-charge circuit controlled by a pre-charge signal, and includes a tank capacitor. The pre-charge circuit is configured to pre-charge the match line to a supply voltage in response to assertion of the pre-charge signal. A pull-down transistor dynamically discharges the virtual-ground line to ground potential.

35 Claims, 14 Drawing Sheets

(56) References Cited

U.S. PATENT DOCUMENTS

| | | |
|---|---|---|
| 5,450,424 A | 9/1995 | Okugaki et al. |
| 5,452,243 A | 9/1995 | Ansel et al. |
| 5,455,834 A | 10/1995 | Chang et al. |
| 5,469,450 A | 11/1995 | Cho et al. |
| 5,491,703 A | 2/1996 | Barnaby et al. |
| 5,561,429 A | 10/1996 | Halberstam et al. |
| 5,568,415 A | 10/1996 | McLellan et al. |
| 5,570,377 A | 10/1996 | Merino Gonzalez et al. |
| 5,572,460 A | 11/1996 | Lien |
| 5,598,115 A | 1/1997 | Holst |
| 5,604,753 A | 2/1997 | Bauer et al. |
| 5,629,950 A | 5/1997 | Godiwala et al. |
| 5,642,320 A | 6/1997 | Jang |
| 5,644,583 A | 7/1997 | Garcia et al. |
| 5,682,394 A | 10/1997 | Blake et al. |
| 5,699,369 A | 12/1997 | Guha |
| 5,724,296 A | 3/1998 | Jang |
| 5,727,003 A | 3/1998 | Zook |
| 5,761,222 A | 6/1998 | Baldi |
| 5,796,671 A | 8/1998 | Wahlstrom |
| 5,796,758 A | 8/1998 | Levitan |
| 5,872,802 A | 2/1999 | Knaack et al. |
| 5,890,201 A | 3/1999 | McLellan et al. |
| 6,009,548 A | 12/1999 | Chen et al. |
| 6,032,214 A | 2/2000 | Farmwald et al. |
| 6,058,500 A | 5/2000 | DesJardins et al. |
| 6,067,656 A | 5/2000 | Rusu et al. |
| 6,125,049 A | 9/2000 | Nataraj |
| 6,128,207 A | 10/2000 | Lien et al. |
| 6,134,631 A | 10/2000 | Jennings, III |
| 6,137,707 A | 10/2000 | Srinivasan et al. |
| 6,151,247 A | 11/2000 | Estakhri et al. |
| 6,154,384 A | 11/2000 | Nataraj et al. |
| 6,166,939 A | 12/2000 | Nataraj et al. |
| 6,188,629 B1 | 2/2001 | Kaplinsky |
| 6,191,969 B1 | 2/2001 | Pereira |
| 6,199,140 B1 | 3/2001 | Srinivasan et al. |
| 6,216,246 B1 | 4/2001 | Shau |
| 6,219,815 B1 | 4/2001 | DesJardins et al. |
| 6,233,717 B1 | 5/2001 | Choi |
| 6,243,280 B1 | 6/2001 | Wong et al. |
| 6,243,281 B1 | 6/2001 | Pereira |
| 6,262,907 B1 | 7/2001 | Lien et al. |
| 6,289,471 B1 | 9/2001 | Gordon |
| 6,324,087 B1 | 11/2001 | Pereira |
| 6,362,990 B1 | 3/2002 | Gibson et al. |
| 6,362,993 B1 | 3/2002 | Henderson et al. |
| 6,374,325 B1 | 4/2002 | Simpson et al. |
| 6,381,191 B2 | 4/2002 | Ooishi |
| 6,385,070 B1 | 5/2002 | Peterson |
| 6,397,290 B1 | 5/2002 | Williams et al. |
| 6,400,593 B1 | 6/2002 | Lien et al. |
| 6,408,417 B1 | 6/2002 | Moudgal et al. |
| 6,418,042 B1 | 7/2002 | Srinivasan et al. |
| 6,421,265 B1 | 7/2002 | Lien et al. |
| 6,430,073 B1 | 8/2002 | Batson et al. |
| 6,430,074 B1 | 8/2002 | Srinivasan |
| 6,434,033 B1 | 8/2002 | Chien |
| 6,460,112 B1 | 10/2002 | Srinivasan et al. |
| 6,470,418 B1 | 10/2002 | Lien et al. |
| 6,477,615 B1 | 11/2002 | Tanaka |
| 6,480,406 B1 | 11/2002 | Jin et al. |
| 6,496,399 B1 | 12/2002 | Choi et al. |
| 6,505,270 B1 | 1/2003 | Voelkel et al. |
| 6,538,911 B1 | 3/2003 | Allan et al. |
| 6,542,391 B2 | 4/2003 | Pereira et al. |
| 6,560,156 B2 | 5/2003 | Lien et al. |
| 6,563,754 B1 | 5/2003 | Lien et al. |
| 6,564,754 B1 | 5/2003 | Cohen |
| 6,597,595 B1 | 7/2003 | Ichiriu et al. |
| 6,618,281 B1 | 9/2003 | Gordon |
| 6,646,900 B2 | 11/2003 | Tsuda et al. |
| 6,665,220 B2 | 12/2003 | Vlasenko |
| 6,690,595 B1 | 2/2004 | Srinivasan et al. |
| 6,700,810 B1 | 3/2004 | Ichiriu et al. |
| 6,700,827 B2 | 3/2004 | Lien et al. |
| 6,707,693 B1 | 3/2004 | Ichiriu |
| 6,721,202 B1 | 4/2004 | Roge et al. |
| 6,728,124 B1 | 4/2004 | Ichiriu et al. |
| 6,741,253 B2 | 5/2004 | Radke et al. |
| 6,760,241 B1 | 7/2004 | Gharia |
| 6,760,881 B2 | 7/2004 | Batson et al. |
| 6,775,168 B1 | 8/2004 | Park et al. |
| 6,804,133 B1 | 10/2004 | Khanna |
| 6,807,077 B2 | 10/2004 | Noda et al. |
| 6,842,360 B1 | 1/2005 | Srinivasan |
| 6,845,026 B1 | 1/2005 | Gharia |
| 6,856,527 B1 | 2/2005 | Srinivasan et al. |
| 6,865,098 B1 | 3/2005 | Ichiriu et al. |
| 6,867,989 B1 | 3/2005 | Roy |
| 6,867,990 B2 | 3/2005 | Regev et al. |
| 6,870,229 B2 | 3/2005 | Dessard et al. |
| 6,888,731 B2 | 5/2005 | Roth et al. |
| 6,900,999 B1 | 5/2005 | Yen et al. |
| 6,967,856 B1 | 11/2005 | Park et al. |
| 7,009,862 B2 | 3/2006 | Higeta et al. |
| 7,050,318 B1 | 5/2006 | Argyres |
| 7,113,415 B1 | 9/2006 | Khanna |
| 7,133,302 B1 | 11/2006 | Srinivasan et al. |
| 7,298,635 B1 | 11/2007 | Maheshwari |
| 7,319,602 B1 | 1/2008 | Srinivasan et al. |
| 7,345,936 B2 | 3/2008 | Notani |
| 7,362,602 B1 | 4/2008 | Meng et al. |
| 7,433,217 B1 | 10/2008 | Maheshwari |
| 7,499,303 B2 | 3/2009 | Lien et al. |
| 7,577,785 B2 | 8/2009 | Yoon et al. |
| 7,800,930 B1 * | 9/2010 | Deshpande et al. ........ 365/49.17 |
| 7,852,652 B1 | 12/2010 | Fabry |
| 7,920,398 B1 | 4/2011 | Khanna et al. |
| 7,924,588 B2 | 4/2011 | Arsovski et al. |
| 7,944,724 B2 | 5/2011 | Chu |
| 8,462,532 B1 | 6/2013 | Argyres |
| 8,553,441 B1 | 10/2013 | Argyres |
| 8,582,338 B1 | 11/2013 | Argyres |
| 8,625,320 B1 | 1/2014 | Argyres |
| 2007/0097722 A1 * | 5/2007 | Phan et al. ...................... 365/49 |
| 2007/0247885 A1 * | 10/2007 | Watanabe et al. ............... 365/49 |
| 2010/0165691 A1 | 7/2010 | Watanabe et al. |
| 2012/0206951 A1 * | 8/2012 | Rachamadugu et al. .. 365/49.17 |
| 2012/0327696 A1 | 12/2012 | Argyres |

OTHER PUBLICATIONS

Fourouzan, B., "Introduction to Telecommunications and Networking." Chapter 8, pp. 194-226, Aug. 1997.

Halsall, F., Data Communications, Computer Networks and OSI, 2d. Ed., pp. 499-508, Addison-Wesley Publ. Co. (1998).

Kalter et al., "A 50-ns 16-Mb DRAM with a 10-ns Data Rate and On-Chip ECC," IEEE Journal of Solid-State Circuits vol. 25, No. 5, Oct. 1990 pp. 1118-1127.

SiberCore Technologies, Soft Error in TCAMS: Causes and Cures, Jul. 2003, 5 pages.

Ex Parte Quayle Action, dated Nov. 7, 2012, for U.S. Appl. No. 13/015,543, filed Jan. 27, 2011, 6 pages.

Notice of Allowance, dated Jan. 23, 2013, for U.S. Appl. No. 13/015,543, filed Jan. 27, 2011, 7 pages.

Notice of Allowance dated Feb. 14, 2013, for U.S. Appl. No. 13/015,543, filed Jan. 27, 2011, 8 pages.

Non-Final Action, dated Nov. 23, 2012, for U.S. Appl. No. 13/149,878, filed May 31, 2011, 5 pages.

Notice of Allowance, dated Mar. 7, 2013, for U.S. Appl. No. 13/149,878, filed May 31, 2011, 5 pages.

Notice of Allowance, dated Jul. 9, 2013, for U.S. Appl. No. 13/149,878, filed May 31, 2011, 6 pages.

Notice of Allowance, dated Oct. 10, 2012, for U.S. Appl. No. 13/149,885, filed May 31, 2011, 9 pages.

Notice of Allowance, dated Jan. 29, 2013, for U.S. Appl. No. 13/149,885, filed May 31, 2011, 5 pages.

Notice of Allowance, dated May 24, 2013, for U.S. Appl. No. 13/149,885, filed May 31, 2011, 6 pages.

Non-Final Action, dated Apr. 5, 2013, for U.S. Appl. No. 13/216,104, filed Aug. 23, 2011, 8 pages.

(56) References Cited

OTHER PUBLICATIONS

Notice of Allowance, dated Jul. 29, 2013, for U.S. Appl. No. 13/216,104, filed Aug. 23, 2011, 11 pages.
Non-Final Action, dated Jan. 24, 2013, for U.S. Appl. No. 13/167,646, filed Jun. 23, 2011, 12 pages.
Notice of Allowance, dated Oct. 21, 2013, for U.S. Appl. No. 13/167,646, filed Jun. 23, 2011, 14 pages.
International Search Report and Written Opinion for International Application No. PCT/US12/42704, Commissioner for Patents, United States, mailed Sep. 12, 2012, 16 pages.

* cited by examiner

US 8,837,188 B1

CONTENT ADDRESSABLE MEMORY ROW HAVING VIRTUAL GROUND AND CHARGE SHARING

TECHNICAL FIELD

The present embodiments generally relate to content addressable memory (CAM) devices, and more particularly to the architecture of rows of CAM cells.

BACKGROUND

Content addressable memory (CAM) devices are frequently used in network switching and routing applications to determine forwarding destinations, to perform classification functions, to implement Quality of Service (QoS) functions, and other tasks associated with routing data packets across a network. More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match condition, and a priority encoder determines the match address or index of the highest priority matching (HPM) entry in the CAM array.

The match lines in a CAM array are typically pre-charged to or towards VDD for each and every compare operation. Thus, for each row having a mismatch condition, an associated match line ML is first pre-charged high towards VDD and then discharged low to ground potential. Current flow associated with this charging and discharging of such match lines results in undesirable power consumption. Further, as the number of CAM cells in each row of a CAM array increases, capacitive loading on the match lines increases accordingly, which further increases power consumption.

Thus, there is a need to reduce the power consumption associated with pre-charging and discharging the match lines of a CAM array during successive compare operations.

BRIEF DESCRIPTION OF THE DRAWINGS

Present embodiments are illustrated by way of example, and not by way of limitation, in the figures of the accompanying drawings and in which like reference numerals refer to similar elements and in which.

DETAILED DESCRIPTION

An apparatus for reducing power consumption in a CAM device is disclosed. In the following description, for purposes of explanation, specific nomenclature is set forth to provide a thorough understanding of the present disclosure. However, it will be apparent to one skilled in the art that these specific details may not be required to practice the present embodiments. In other instances, well-known circuits and devices are shown in block diagram form to avoid obscuring the present embodiments unnecessarily. Additionally, the interconnections between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

Figure 1A:
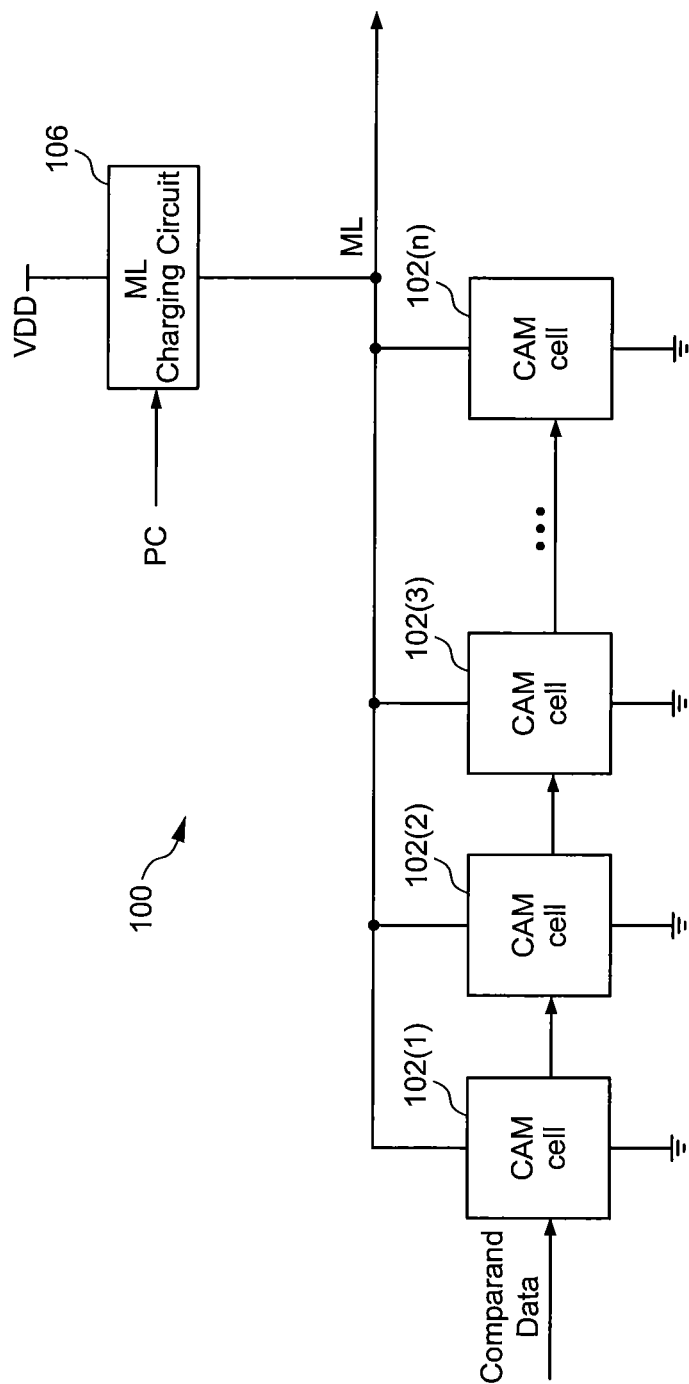
FIG. 1A is a block diagram of a CAM row.

FIG. 1A shows a CAM row 100 as having a number of CAM cells 102(1)-102(n) each coupled to an associated match line ML. Each CAM cell 102 is coupled between match line ML and ground potential. Although not shown for simplicity, each CAM cell 102 includes at least one storage element to store one or more data bits and includes at least one compare circuit that compares a bit of a search key (e.g., a comparand word) with data stored in the storage element. The storage element can be implemented using Static Random Access Memory (SRAM), Dynamic RAM (DRAM), a non-volatile memory cell (e.g., EEPROM or flash memory cell), or any other suitable memory element. For simplicity, word lines, bit lines, comparand lines, and other well-known elements of the associated CAM array are not shown in FIG. 1A. In addition, various well-known clock, enable, and control signals are not shown in FIG. 1A for simplicity.

A match line charging circuit 106 is coupled between a supply voltage VDD and match line ML, and includes an input to receive a pre-charge signal (PC). Prior to each compare operation between an n-bit comparand word and an n-bit CAM word stored in CAM cells 102(1)-102(n), match line ML is pre-charged to VDD via match line charging circuit 106 in response to PC. Then, the n-bits of the comparand word are compared with corresponding bits of the CAM word in respective CAM cells 102(1)-102(n). If all bits of the comparand word match corresponding bits of the CAM word, then the match line ML remains in its charged state to indicate a match condition. Conversely, if one or more of the comparand bits do not match corresponding bits of the CAM word, then the one or more mismatching CAM cells 102 discharge match line ML low toward ground potential to indicate a mismatch condition.

Figures 1B, 1C:
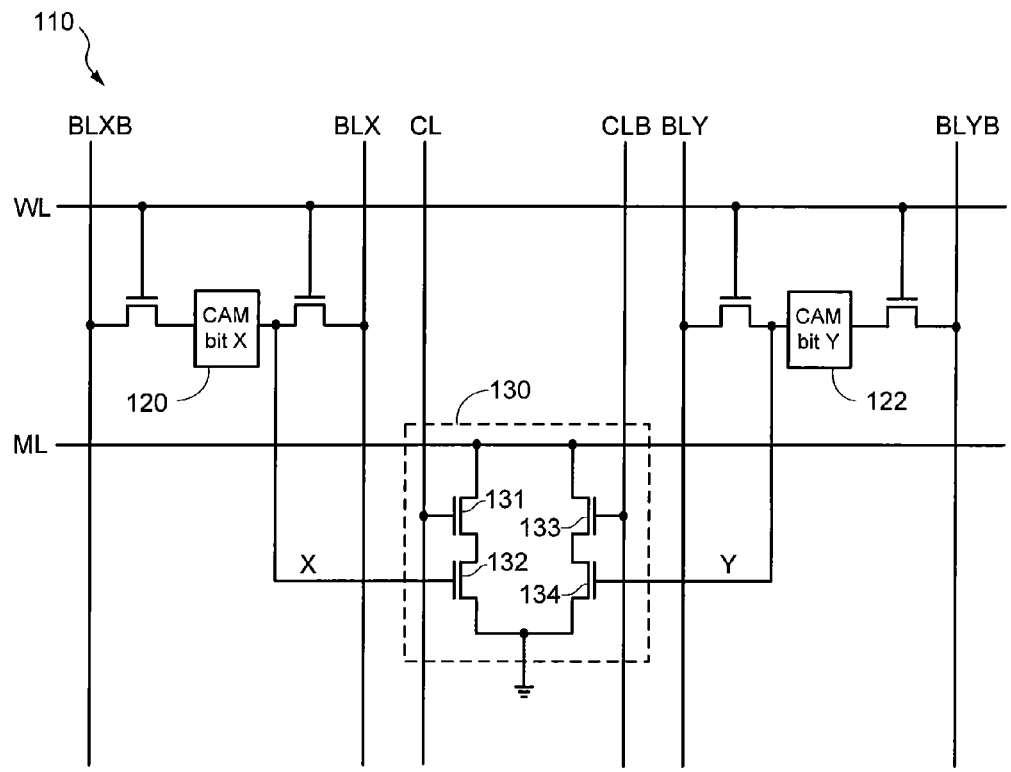
FIG. 1B is a circuit diagram of a quaternary (XY) CAM cell.
FIG. 1C shows a truth table for data storage of the XY CAM cell of FIG. 1B.

For example, FIG. 1B shows a quaternary CAM cell 110. Quaternary CAM cell 110, which is also referred to as an XY CAM cell, includes two storage cells 120 and 122 coupled to a compare circuit 130, where the X cell 120 stores a first data bit X and the Y cell 122 stores a second data bit Y. More specifically, the two data bits X and Y can collectively represent four possible states: "0", "1", "don't care", and a fourth state which may be left unused or may indicate "invalid," as depicted in FIG. 1C. The logic "0" and "1" states correspond to the logic states represented, for example, by a conventional binary CAM cell. For each of these states, if the comparand data (e.g., provided to CAM cell 110 via complementary comparand lines CL and CLB) matches the data stored in CAM cell 110, compare circuit 130 does not discharge the match line ML, thereby indicating a match condition. Conversely, if the comparand data does not match the data stored in CAM cell 110, compare circuit 130 discharges match line ML (e.g., toward ground potential) to indicate the mismatch condition. For the "don't care" state, the logic low values for X and Y maintain respective transistors 132 and 134 in non-conductive states, thereby preventing compare circuit 130 from discharging match line ML. In this manner, data stored in CAM cell 110 is masked from the compare operation, thereby forcing a match condition for CAM cell 110, regardless of the comparand data. For the "invalid" state, the logic high values for X and Y maintain respective transistors 132 and 134 in conductive states. During a compare operation, one of the complementary comparand data bit pair provided on CL/CLB will be logic high, thereby causing compare circuit 130 to discharge match line ML to indicate a mismatch condition, regardless of the comparand data.

The present embodiments reduce power consumption of CAM devices during compare operations between a search key and data stored in the device's array by reducing the amount of electric charge by which the match line is discharged during mismatch conditions. More specifically, for some embodiments, respective rows (e.g., each row) of the CAM array includes circuitry that discharges the match line to a virtual ground line (e.g., rather than to ground potential) during mismatch conditions. Because the electrical potential on the virtual ground line is greater than ground potential, power consumption associated with pre-charging the match line back to a logic high state during the next compare operation is reduced, as compared to techniques that discharge the match line completely to ground potential.

In addition, for some embodiments, the power terminal of a match detect circuit is connected to the virtual ground node instead of ground potential, which advantageously reduces undesirable crowbar currents in the match detect circuit. Further, for other embodiments, the CAM row is modified to include a match line pre-charging circuit that utilizes a tank capacitor to increase the rate at which the match line can be charged.

Figure 2:
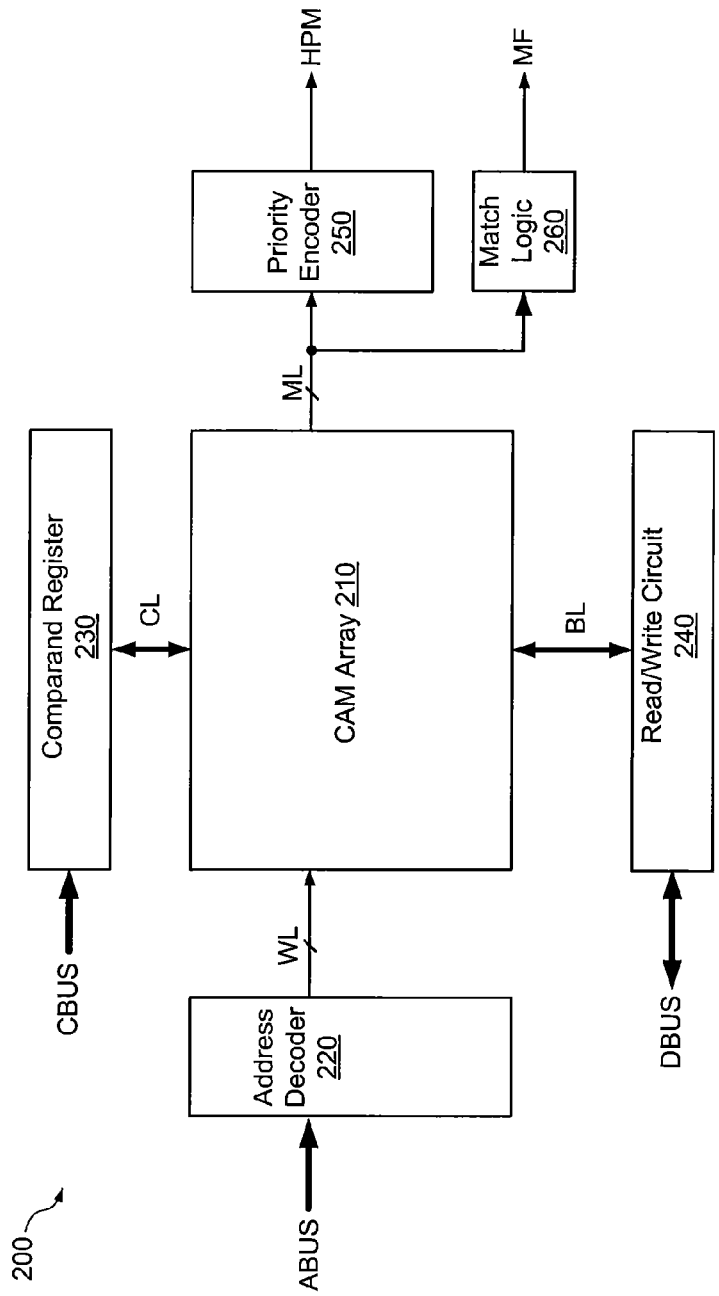
FIG. 2 is a block diagram of a CAM device within which the present embodiments may be implemented.

FIG. 2 is a block diagram of a CAM device 200 within which the present embodiments can be implemented. CAM device 200 includes a CAM array 210, an address decoder 220, a comparand register 230, a read/write circuit 240, a priority encoder circuit 250, and match logic 260. CAM array 210 includes any number of rows of CAM cells (not shown for simplicity in FIG. 2), where each row of CAM cells can be configured to store a data word. Further, while CAM array 210 is shown in FIG. 2 as a single CAM array, it may include any number of CAM array blocks that can be independently searched.

One or more instructions and related control signals may be provided to CAM device 200 from an instruction decoder (not shown for simplicity) to control read, write, compare, and other operations for CAM device 200. Other well-known signals that can be provided to CAM device 200, such as enable signals, clock signals, and power connections, are not shown for simplicity. Further, although not shown in FIG. 2, each row of CAM cells in CAM array 210 may have one or more validity bits to indicate whether the corresponding row (or any segment thereof) of CAM cells stores valid data.

Each row of CAM cells (not shown in FIG. 2 for simplicity) in CAM array 210 is coupled to address decoder 220 via a corresponding word line WL, and to priority encoder 250 and to well-known match logic 260 via a corresponding match line ML. For simplicity, the word lines and match lines are represented collectively in FIG. 2. Address decoder 220 is well-known, and includes circuitry to select corresponding rows in CAM array 210 for read, write, and/or other operations in response to an address received from an address bus ABUS using the word lines WL. For other embodiments, addresses may be provided to address decoder 220 from another suitable bus and/or circuitry.

The match lines ML provide match results for compare operations between comparand data (e.g., a search key) and data stored in CAM array 210. Priority encoder 250, which is well-known, uses the match results indicated on the match lines to determine the matching entry that has the highest priority number associated with it and generates the index or address of this highest priority match (HPM). In addition, priority encoder 250 may use the validity bits from CAM array 210 to generate the next free address that is available in CAM array 210 for storing new data. Although not shown in FIG. 2, for some embodiments, priority encoder 250 may provide the next free address to the address decoder 220.

Match logic 260, which is well-known, uses the match results indicated on the match lines to generate a match flag (MF) indicative of a match condition in CAM array 210. If there is more than one matching entry in CAM array 210, match logic 260 may generate a multiple match flag to indicate a multiple match condition. In addition, match logic 260 may use the validity bits from CAM array 210 to assert a full flag when all of the rows of CAM cells in CAM array 210 are filled with valid entries.

Each column of CAM cells (not shown in FIG. 2 for simplicity) in CAM array 210 is coupled to comparand register 230 via one or more corresponding comparand lines CL, and is coupled to read/write circuit 240 via one or more corresponding bit lines BL. For simplicity, the comparand lines CL and bit lines BL are represented collectively in FIG. 2. Comparand register 230 is well-known, and is configured to provide a search key (e.g., a comparand word) received from a comparand bus CBUS to CAM array 210 during compare operations with data stored therein. For other embodiments, the search key can be provided to CAM array 210 via another bus and/or circuit. Read/write circuit 240 includes well-known write drivers to write data received from a data bus DBUS to CAM array 210 via the bit lines BL, and includes well-known sense amplifiers to read data from CAM array 210 onto DBUS. For other embodiments, read/write circuit 240 may be coupled to a bus other than DBUS. Further, although not shown in FIG. 2 for simplicity, CAM device 200 can include a well-known global mask circuit (e.g., coupled to the comparand register 230) that can selectively mask the bits of the search key provided to the CAM array 210.

Figure 3:
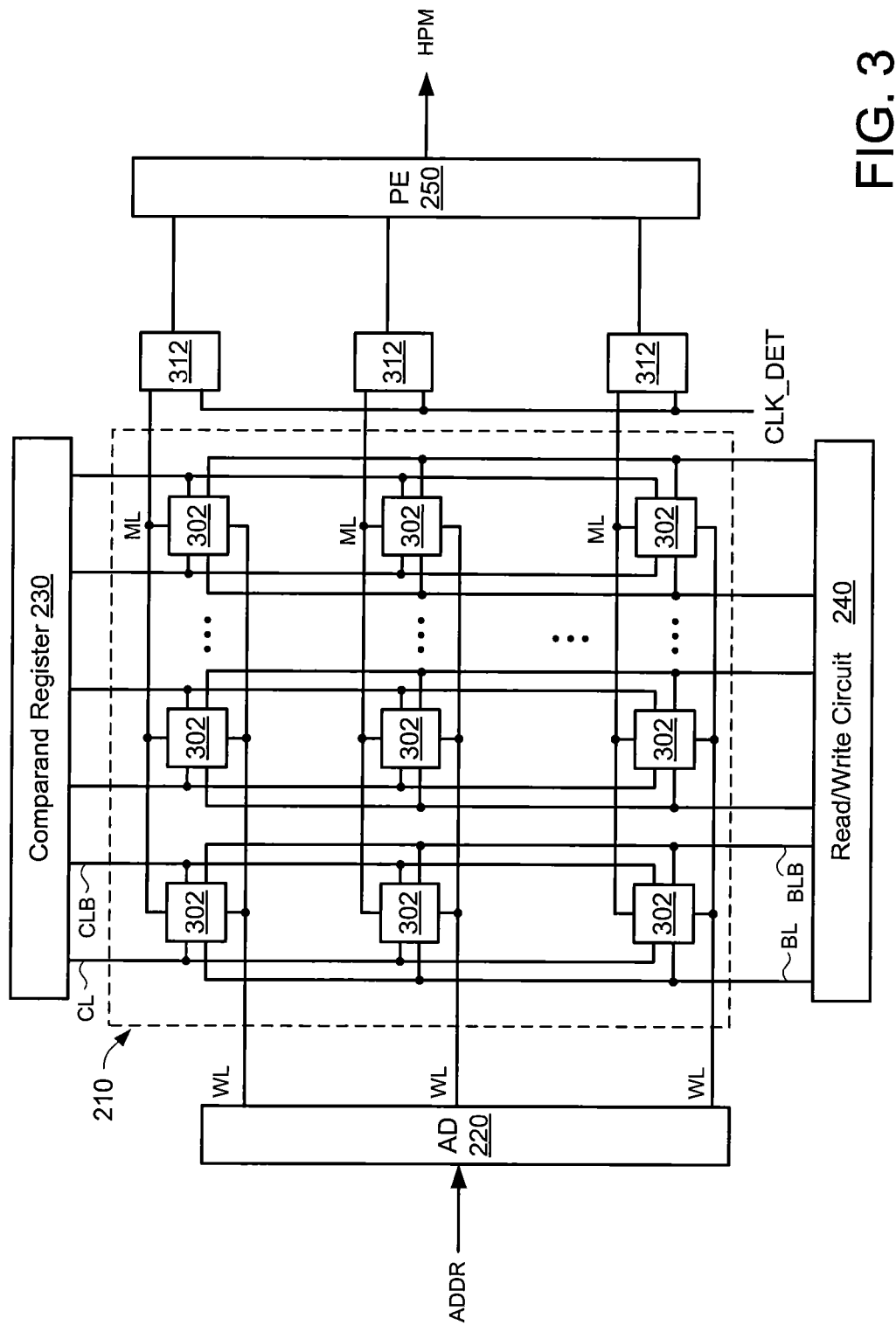
FIG. 3 is a block diagram of one embodiment of the CAM array of FIG. 2.

FIG. 3 is a more detailed block diagram of one embodiment of CAM array 210 of FIG. 2. CAM array 210 is shown to include a plurality of CAM cells 302 (e.g., including cells 102(1)-102(n), FIG. 1A) organized in any number of rows and columns. The CAM cells 302 can be any suitable type of CAM cell including, for example, binary CAM cells, ternary CAM cells, and/or quaternary CAM cells (e.g., quaternary CAM cells 110, FIG. 1B). As noted above, each row of CAM array 210 may also include one or more validity bits. Each row of CAM cells 302 is coupled to a match line ML and to a word line WL. Each word line WL is driven by address decoder 220 to select one or more rows of CAM cells 302 for writing or reading. Each match line ML is coupled to priority encoder 250 via a corresponding match detect circuit 312. The match detect circuits 312 are clocked by a match detect clock signal CLK_DET in a well-known manner. Each column of CAM cells 302 in CAM array 210 is coupled to read/write circuit 240 via a complementary bit line pair BL/BLB, and to comparand register 230 via a complementary comparand line pair CL/CLB.

Prior to compare operations, the match lines ML are pre-charged (e.g., to logic high), and each set of complementary comparand line pairs CL/CLB are driven to the same predetermined logic level (e.g., to logic low). Then, during compare operations, the comparand register 230 provides the search key (e.g., the comparand word) to the CAM cells 302 by driving each pair of complementary comparand lines CL/CLB to opposite logic states indicative of the corresponding bit of the search key. For example, to provide a logic low comparand bit (C) to a column of CAM cells, the corresponding comparand line CL is driven to a logic low state and the corresponding complementary comparand line CLB is driven to a logic high state; conversely, to provide a logic high comparand bit C to the column of CAM cells, the corresponding comparand line CL is driven to the logic high state and the corresponding complementary comparand line CLB is driven to the logic low state. Thereafter, if the data bits in all the CAM cells 302 in a particular row match the corresponding bits of the search key, then the match line ML remains in its pre-charged (e.g., logic high) state to indicate the match condition. Conversely, if the data bits in one or more of the CAM cells 302 in the row do not match the corresponding bit of the search key, then mismatching CAM cells 302 discharge the match line (e.g., toward ground potential) to indicate the mismatch condition.

Figure 4:
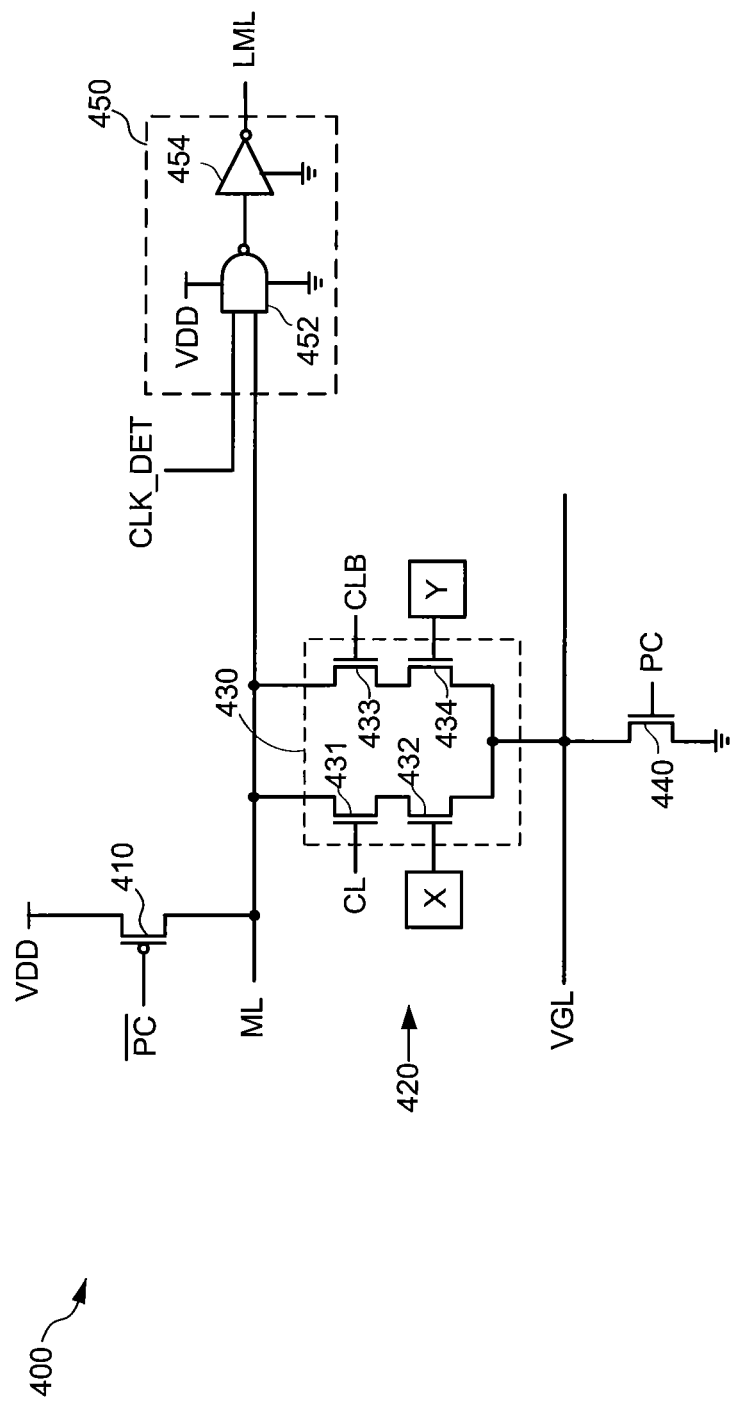
FIG. 4 is a circuit diagram of a CAM row including a CAM cell configured in accordance with some embodiments.

FIG. 4 shows a CAM row 400 in accordance with some of the present embodiments. CAM row 400, which can be deployed in CAM arrays of the type described above with respect to FIGS. 2-3, is shown to include a PMOS match line pre-charge transistor 410, a CAM cell 420, a match line ML, a virtual-ground line (VGL), an NMOS discharge transistor 440, and a match detect circuit 450. For simplicity, only one CAM cell 420 is depicted in CAM row 400. For actual embodiments, CAM row 400 can have any number of CAM cells 420. Further, for simplicity, only the X and Y storage cells and compare circuit 430 of CAM cell 420 are shown in FIG. 4. While the CAM cell 420 is shown as a quaternary CAM cell, in alternate embodiments the CAM cell 420 is another type of CAM cell (e.g., a binary or ternary CAM cell).

Pre-charge transistor 410 is connected between the supply voltage VDD and match line ML, and has a gate to receive a complemented pre-charge signal $\overline{PC}$. Compare circuit 430, which is connected between match line ML and the virtual-ground line (VGL), includes two parallel discharge paths between match line ML and virtual-ground line VGL. One path includes series-connected transistors 431 and 432 having respective gate terminals to receive a comparand bit from comparand line CL and to receive the data bit X, and the other path includes series-connected transistors 433 and 434 having respective gate terminals to receive a complimentary comparand bit from complementary comparand line CLB and to receive the data bit Y.

NMOS discharge transistor 440 is connected between VGL and ground potential, and has a gate to receive the pre-charge signal PC. In this manner, compare circuit 430 and virtual-ground line VGL are selectively connected to ground potential by discharge transistor 440 in response to pre-charge signal PC. This is in contrast to CAM row and cell architectures in which the compare circuit is directly connected to ground potential, for example, as for CAM cell 110 of FIG. 1B.

Match detect circuit 450 includes a NAND gate 452 and a CMOS inverter 454. NAND gate 452, which is well-known, has a first input coupled to match line ML, a second input to receive a match detect clock signal CLK_DET, and an output coupled to the input of inverter 454. The output of inverter 454 provides a latched match line (LML) signal. Note that the NAND gate 452 includes power terminals coupled to VDD and ground potential, as depicted in FIG. 4.

During a pre-charge phase of a compare operation, the pre-charge signal PC is asserted (e.g., to logic high). In response thereto, discharge transistor 440 turns on and discharges the virtual-ground line VGL low to ground potential. The resulting logic low state of $\overline{PC}$ turns on pre-charge transistor 410, which pre-charges the match line ML high towards VDD. Referring also to FIG. 3, the comparand lines CL/CLB are both pre-charged to logic low during the pre-charge phase of the compare operation.

Then, during an evaluation phase of the compare operation, the pre-charge signal PC is de-asserted (e.g., to logic low), the complementary comparand bits are provided to the gates of transistors 431 and 433 via comparand lines CL and CLB, respectively, and CLK_DET is asserted (e.g., to logic high). The de-asserted state of PC turns off discharge transistor 440 to isolate the VGL from ground potential. The resulting logic high state of $\overline{PC}$ turns off pre-charge transistor 410. If the comparand bit matches the data value stored in CAM cell 420, then compare circuit 430 is non-conductive and isolates match line ML from the VGL, thereby allowing match line ML to remain in its pre-charged logic high state to indicate the match condition. In this case, both match line ML and the virtual-ground line VGL substantially maintain their respective high and low voltage levels. The logic high state of the match line ML is detected by match detect circuit 450 in response to CLK_DET, and then provided as a logic high output signal.

Conversely, if the comparand bit does not match the data value stored in CAM cell 420, then compare circuit 430 turns on and connects the match line ML to the VGL, thereby allowing match line ML to discharge to the VGL. The resulting logic low state of match line ML is detected by match detect circuit 450 in response to CLK_DET, and then provided as a logic low output signal. Note that as match line ML discharges to the VGL, the VGL slowly charges towards the voltage level of match line ML. As a result, the voltage levels of match line ML and the VGL converge to substantially the same voltage level during mismatch conditions (e.g., as discussed in more detail below with respect to FIG. 5B). Thereafter, during the pre-charge phase of the next compare operation, assertion of PC turns on discharge transistor 440, which discharges any residual charge on the VGL to ground potential.

Turning off discharge transistor 440 during the evaluation phase of the compare operation not only prevents a DC path between the match line ML and ground potential, but also prevents match line ML from being completely discharged to ground potential during mismatch conditions. In this manner, the match line ML can be more easily pre-charged towards VDD by pre-charge transistor 410 during the pre-charge phase of the next compare operation, thereby reducing power consumption (e.g., as compared to CAM rows in which the match line ML is completely discharged to ground potential during mismatch conditions).

Figure 5A:
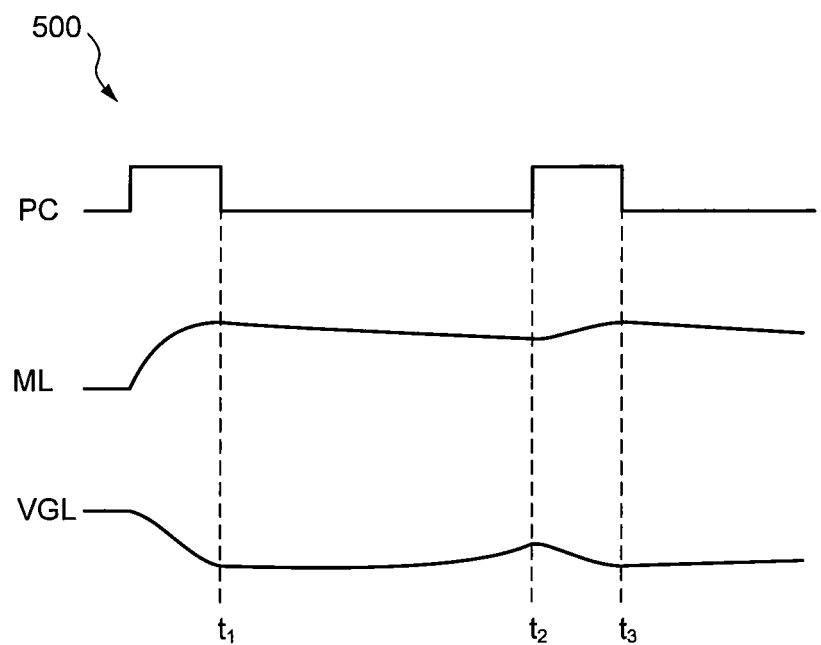
FIG. 5A is a timing diagram depicting a match condition in the CAM row of FIG. 4.

FIG. 5A is a timing diagram 500 depicting various signal and line voltages corresponding to a match condition in CAM cell 420 of FIG. 4. During the pre-charge phase of the compare operation, the pre-charge signal PC is asserted to logic high (and thus $\overline{PC}$ is asserted to logic low). In response thereto, PMOS pre-charge transistor 410 turns on and charges match line ML high towards VDD, and NMOS discharge transistor 440 turns on and discharges the VGL low to ground potential. Then, during the evaluation phase of the compare operation (e.g., between times $t_1$ and $t_2$), the pre-charge signal PC is de-asserted to logic low (and thus $\overline{PC}$ is de-asserted to logic high). In response thereto, PMOS pre-charge transistor 410 turns off and isolates match line ML from VDD, and NMOS discharge transistor 440 turns off and isolates the VGL from ground potential. Because the comparand bit matches the data stored in CAM cell 420, compare circuit 430 does not connect the match line ML to the VGL, thereby allowing the match line ML to remain in its charged logic high state and allowing the VGL to remain close to ground potential. As a result, the differential voltage between match line ML and the VGL is approximately equal to VDD during match conditions.

Note that because of leakage currents in compare circuit 430 during the match condition, the match line voltage slightly decreases from VDD in the period between times $t_1$ and $t_2$, which in turn causes the voltage on the VGL to slightly increase from ground potential, as depicted in FIG. 5A. Then, during the pre-charge phase of the next compare operation, assertion of PC to logic high (at time $t_2$) turns on discharge transistor 440 to discharge the VGL back to ground potential, and assertion of $\overline{PC}$ to logic low turns on pre-charge transistor 410 to charge the match line ML back to VDD.

Figure 5B:
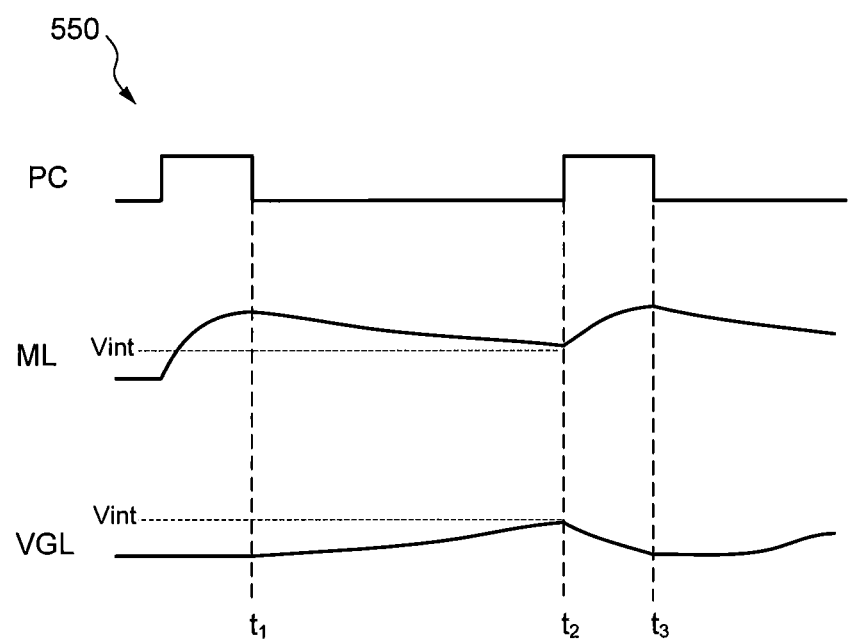
FIG. 5B is a timing diagram depicting a mismatch condition in the CAM row of FIG. 4.

FIG. 5B is a timing diagram 550 depicting signals corresponding to a mismatch condition in CAM cell 420 of FIG. 4. As in diagram 500, during the pre-charge phase, the match line ML voltage is charged towards VDD and the VGL voltage is discharged towards ground potential in response to assertion of PC. However, in response to the mismatch condition during the evaluation phase, compare circuit 430 of CAM cell 420 discharges the match line ML low towards the VGL, which is isolated from ground potential by the non-conductive state of discharge transistor 440 (e.g., in response to de-assertion of PC). More specifically, discharging the match line ML to the VGL results in a corresponding charging of the VGL so that the match line voltage and the VGL voltage converge towards a common intermediate voltage level (Vint) at time $t_2$. Indeed, for sufficiently far apart pulses of PC, the match line voltage and the VGL voltage eventually reach the common intermediate voltage level at the end of the evaluation phase so that the differential voltage between match line ML and the VGL is approximately equal to zero during mismatch conditions. In this manner, the CAM row and cell architecture of FIG. 4 can improve noise margin and reduce power consumption, as compared to CAM row and cell architectures discussed above with respect to FIG. 1B.

Although inclusion of the VGL reduces power consumption during successive compare operations, the resulting intermediate voltage on match line ML during mismatch conditions can undesirably lead to crowbar currents in match detect circuit 450. More specifically, when the match line voltage is equal to the intermediate voltage (Vint) following a mismatch condition, the associated NMOS pull-down transistor (not shown for simplicity) within NAND gate 452 that is driven by the match line ML may not completely turn off, thereby resulting in undesirable crowbar currents through NAND gate 452. To eliminate such undesirable crowbar currents, the ground terminal of the match detect circuit can be connected to the VGL instead of ground potential, as discussed below with respect to FIG. 6A.

Figure 6A:
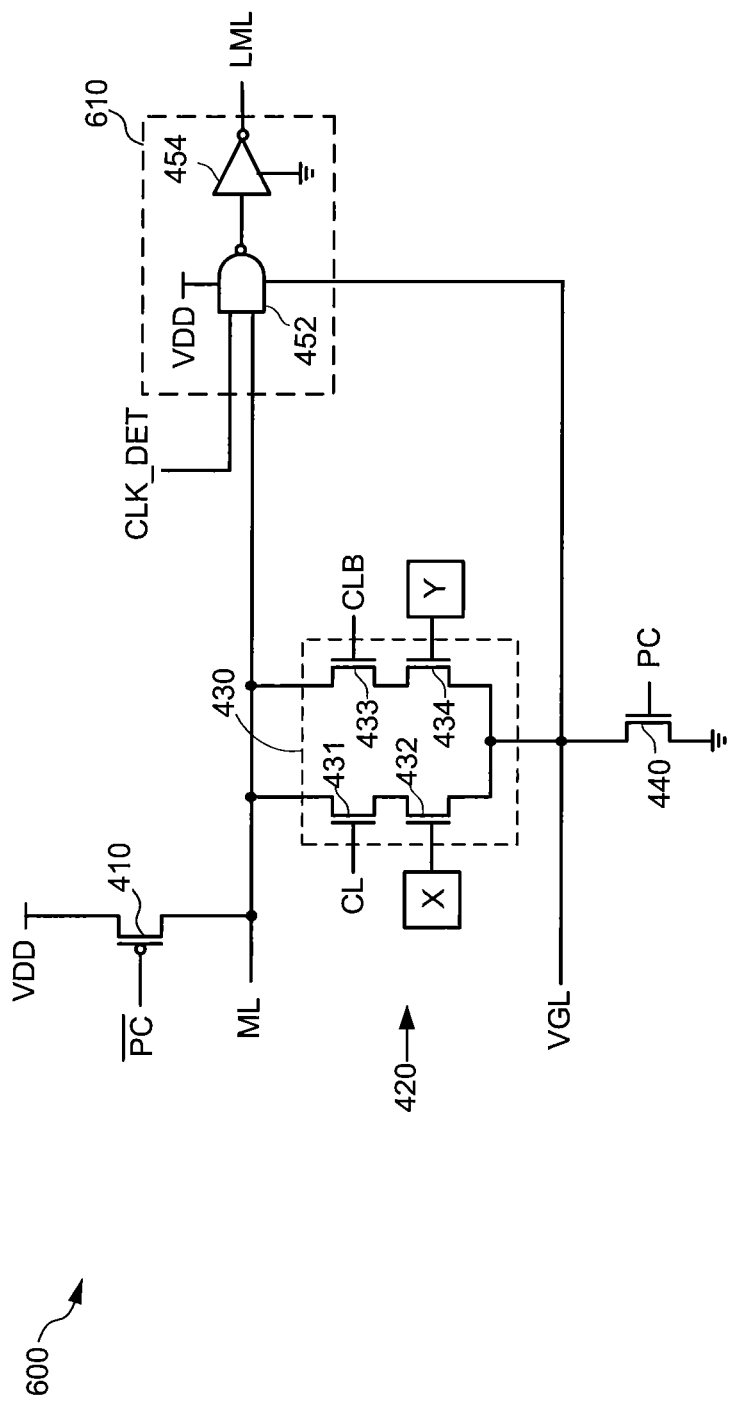
FIG. 6A is a circuit diagram of a row including the CAM cell of FIG. 4 coupled to a match logic configured in accordance with some embodiments.

FIG. 6A is a circuit diagram of a CAM row 600 including CAM cell 420 of FIG. 4 coupled to a match detect circuit 610 configured in accordance with some embodiments. CAM row 600, which can be deployed in CAM arrays of the type described above with respect to FIGS. 2-3, is shown to include PMOS match line pre-charge transistor 410, CAM cell 420, NMOS discharge transistor 440, match line ML, the VGL, and match detect circuit 610. For simplicity, only one CAM cell 420 is depicted in CAM row 600. For actual embodiments, CAM row 600 can have any number of CAM cells 420. Further, for simplicity, only the X and Y storage cells and compare circuit 430 are shown in FIG. 6A.

CAM row 600 is similar to CAM row 400 of FIG. 4, except that the ground terminal of match detect circuit 610 is connected to the VGL instead of ground potential. Connecting the ground terminal of match detect circuit 610 to the VGL instead of ground potential allows the gate-to-source voltage ($V_{GS}$) of the NAND gate's NMOS pull-down transistor (not shown in FIG. 6A for simplicity) to be almost zero during a mismatch condition, which in turn advantageously reduces the crowbar current of NAND gate 452. Further, connecting the ground terminal of match detect circuit 610 to the VGL instead of ground potential improves the noise margin of match detect circuit 610 by altering the trip point that distinguishes detection of match and mismatch conditions.

Figure 6B:
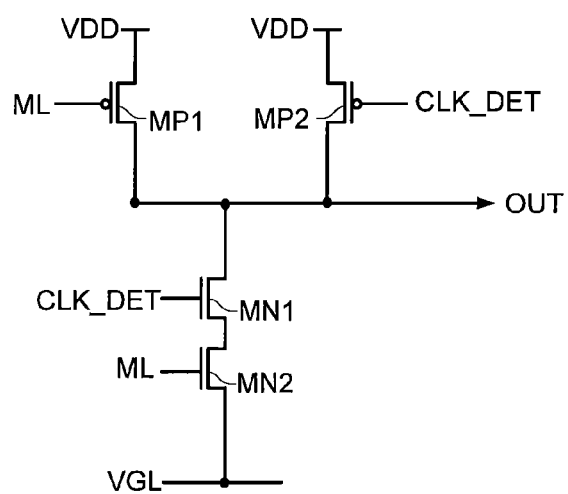
FIG. 6B is a circuit diagram of a portion of the match logic of FIG. 6A in accordance with some embodiments.

For example, FIG. 6B shows a circuit diagram of a NAND gate 605 that is one embodiment of NAND gate 452 of FIG. 6A. NAND gate 605 includes two PMOS transistors MP1-MP2 and two NMOS transistors MN1-MN2. PMOS transistor MP1 is connected between VDD and an output terminal (OUT) of NAND gate 605, and has a gate coupled to match line ML. PMOS transistor MP2 is connected between VDD and OUT, and has a gate to receive CLK_DET. NMOS transistors MN1 and MN2 are connected in series between OUT and the VGL, with the gate of transistor MN1 to receive CLK_DET and the gate of transistor MN2 coupled to match line ML. Thus, as mentioned above, NAND gate 605 has power terminals connected to VDD and to the VGL, rather than to VDD and to ground potential. In this manner, when the match line voltage and the VGL voltage are both approximately equal to the intermediate voltage (Vint) following a mismatch condition (see also FIG. 5B), the gate and source voltages of transistor MN2 are also both approximately equal to Vint. As a result, the $V_{GS}$ of transistor MN2 is approximately zero during the mismatch condition, thereby desirably maintaining transistor MN2 in a non-conductive state and significantly reducing the crowbar current.

Figure 6C:
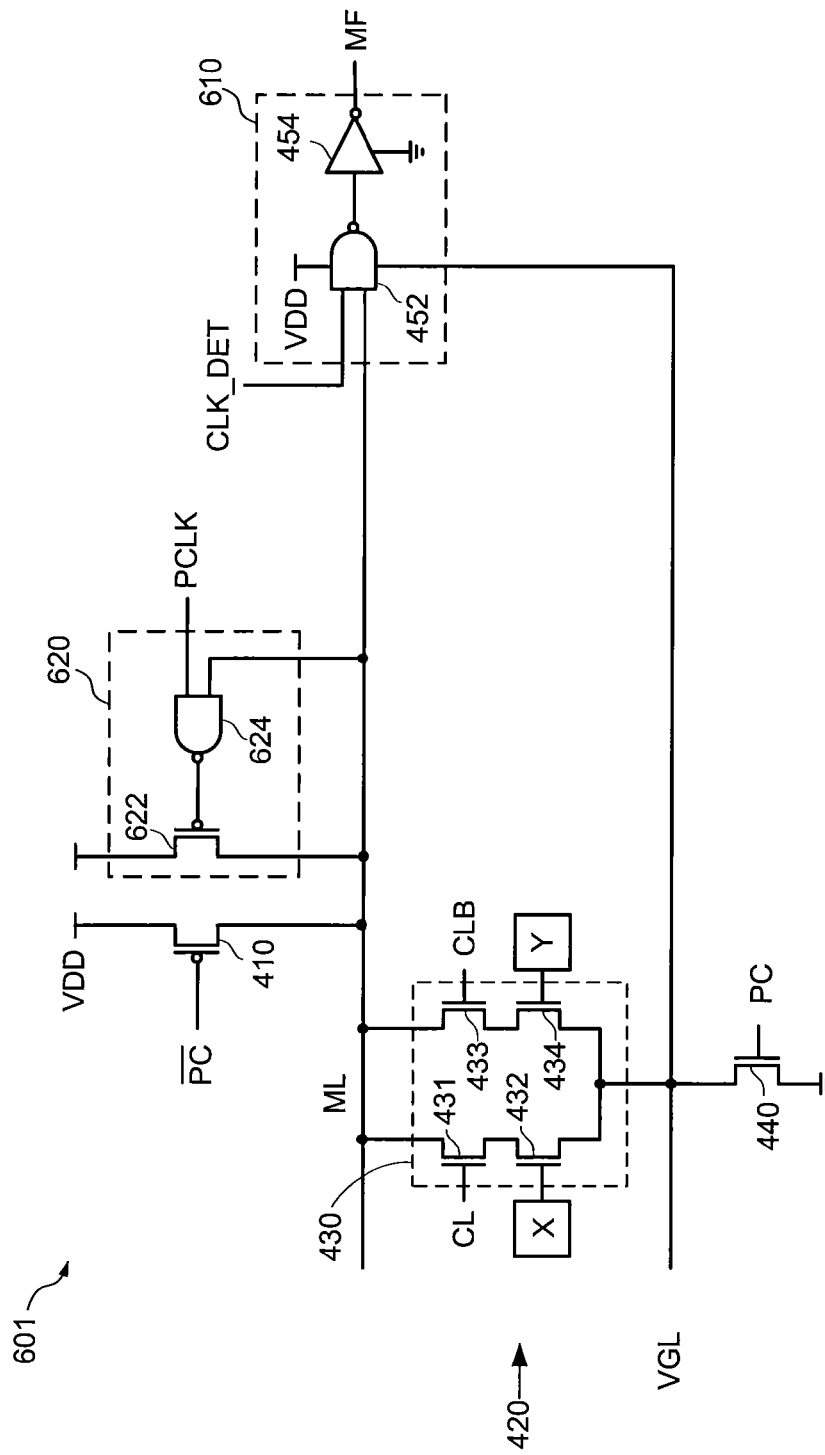
FIG. 6C is a circuit diagram of a CAM row including CAM cell of FIG. 4 coupled to match logic of FIG. 6A and to a second pre-charging circuit in accordance with some embodiments.

FIG. 6C is a circuit diagram of a CAM row 601 having CAM cell 420 of FIG. 4 coupled to match detect circuit 610. CAM row 601, which can be deployed in CAM arrays of the type described above with respect to FIGS. 2-3, is shown to include pre-charge transistor 410, CAM cell 420, NMOS discharge transistor 440, the VGL, match line ML, match detect circuit 610, and a match line keeper circuit 620. For simplicity, only one CAM cell 420 is depicted in CAM row 601. For actual embodiments, CAM row 601 can have any number of CAM cells 420. Further, for simplicity, only the X and Y storage cells and compare circuit 430 of CAM cell 420 are shown in FIG. 6C.

CAM row 601 is similar to CAM row 600 of FIG. 6A, except that CAM row 601 also includes match line keeper circuit 620 connected between VDD and the match line ML. Keeper circuit 620, which includes a PMOS transistor 622 and a NAND gate 624, acts as a keeper circuit to compensate for leakage currents associated with CAM cell 420. PMOS transistor 622 is connected between VDD and match line ML, and has a gate coupled to an output of NAND gate 624. A first input of NAND gate 624 is connected to match line ML, and a second input of NAND gate 624 is coupled to receive a pre-charge clock signal PCLK.

During the pre-charge phase of the compare operation, the pre-charge signal PC is asserted to logic high (and thus $\overline{PC}$ is asserted to logic low). In response thereto, PMOS pre-charge transistor 410 turns on and charges match line ML high towards VDD, and NMOS discharge transistor 440 turns on and discharges the VGL low to ground potential. Then, during the evaluation phase of the compare operation, the pre-charge signal PC is de-asserted to logic low (and thus $\overline{PC}$ is de-asserted to logic high). In response thereto, PMOS pre-charge transistor 410 turns off and isolates match line ML from VDD, and NMOS discharge transistor 440 turns off and isolates the VGL from ground potential. In addition, PCLK is asserted to logic high during the evaluation phase to allow NAND gate 624 to turn on PMOS pull-up transistor 622 if the match line ML is in a charged logic high state.

If there is a match condition, compare circuit 430 does not connect the match line ML to the VGL, thereby allowing the match line ML to remain in its charged logic high state and allowing the VGL to remain close to ground potential. The logic high state of match line ML forces the output of NAND gate 624 to logic low, thereby turning on PMOS pull-up transistor 622 to charge match line ML towards VDD. In this manner, PMOS transistor 622 and NAND gate 624 together act as a keeper circuit to maintain match line ML in its charged logic high state. Conversely, if there is a mismatch condition, compare circuit 430 discharges the match line ML to the VGL (e.g., in a manner similar to that described above with respect to FIG. 5B). The resulting logic low state of match line ML forces the output of NAND gate 624 to logic high, thereby turning off PMOS pull-up transistor 622 and isolating match line ML from VDD.

Figure 7:
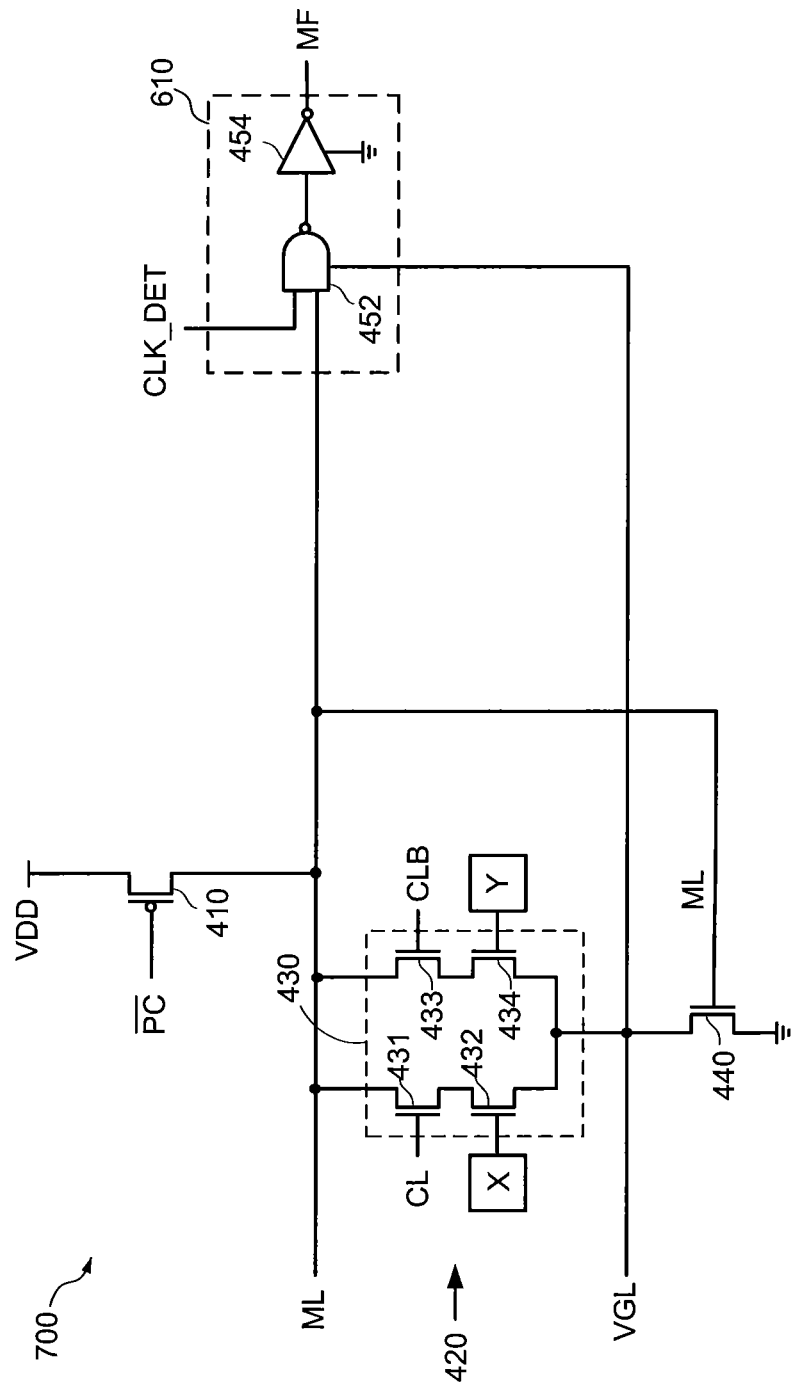
FIG. 7 is a circuit diagram of a CAM row including a CAM cell configured in accordance with other embodiments.

FIG. 7 is a circuit diagram of a CAM row 700 including CAM cell 420 of FIG. 4 coupled to match detect circuit 610 configured in accordance with some embodiments. CAM row 700, which can be deployed in CAM arrays of the type described above with respect to FIGS. 2-3, is shown to include PMOS match line pre-charge transistor 410, CAM cell 420, NMOS discharge transistor 440, the VGL, match line ML, and match detect circuit 610. For simplicity, only one CAM cell 420 is depicted in CAM row 700. For actual embodiments, CAM row 700 can have any number of CAM cells 420. Further, for simplicity, only the X and Y storage cells and compare circuit 430 of CAM cell 420 are shown in FIG. 7. For other embodiments, row 700 can include the match line keeper circuit 620 of FIG. 6C.

CAM row 700 is similar to CAM row 600 of FIG. 6A, except that the gate of NMOS discharge transistor 440 is connected to match line ML instead of receiving the pre-charge signal PC. Connecting the gate of discharge transistor 440 to match line ML rather than the PC signal can reduce power consumption by limiting the minimum voltage of match line ML during mismatch conditions to the threshold voltage (VT) of NMOS discharge transistor 440 (e.g., rather than to ground potential).

Figure 8A:
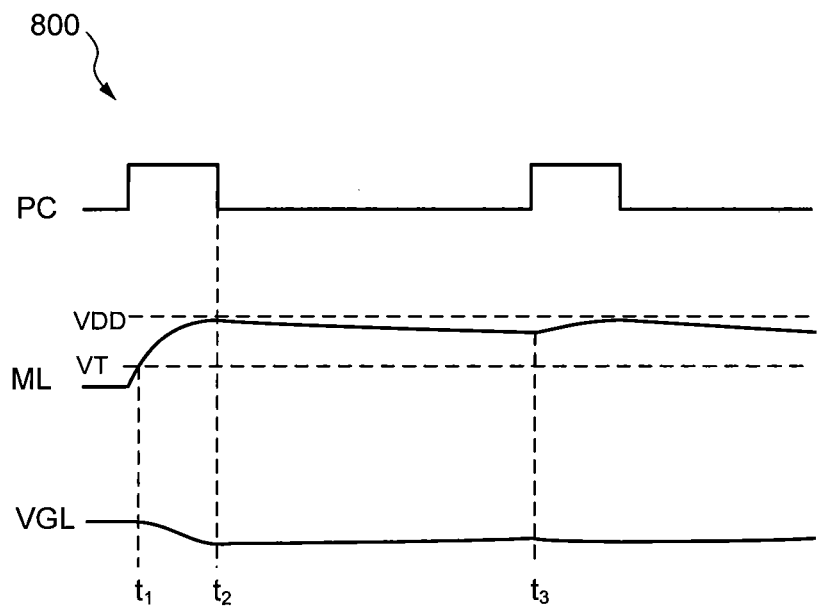
FIG. 8A is a timing diagram depicting a match condition in the CAM row of FIG. 7.

For example, FIG. 8A is a timing diagram 800 depicting various signal and line voltages corresponding to a match condition in the embodiment of FIG. 7. During the pre-charge phase of the compare operation, the PC signal is asserted (e.g., to logic high) so that PMOS pre-charge transistor 410 pulls match line ML high towards VDD. The logic high voltage on match line ML turns on NMOS discharge transistor 440, which discharges the VGL to ground potential. Referring also to FIG. 3, the comparand lines CL/CLB are both pre-charged to logic low during the pre-charge phase of the compare operation.

Then, during the evaluation phase (e.g., between times $t_2$ and $t_3$), compare circuit 430 is non-conductive in response to the match condition, and match line ML remains in its charged logic high state (e.g., at approximately VDD). The resulting logic high state of match line ML maintains NMOS discharge transistor 440 in a conductive state, thereby maintaining the VGL at ground potential. Thus, although the match line voltage can slightly discharge because of leakage currents in compare circuit 430, the conductive state of NMOS discharge transistor 440 prevents charge from undesirably accumulating on the VGL.

Figure 8B:
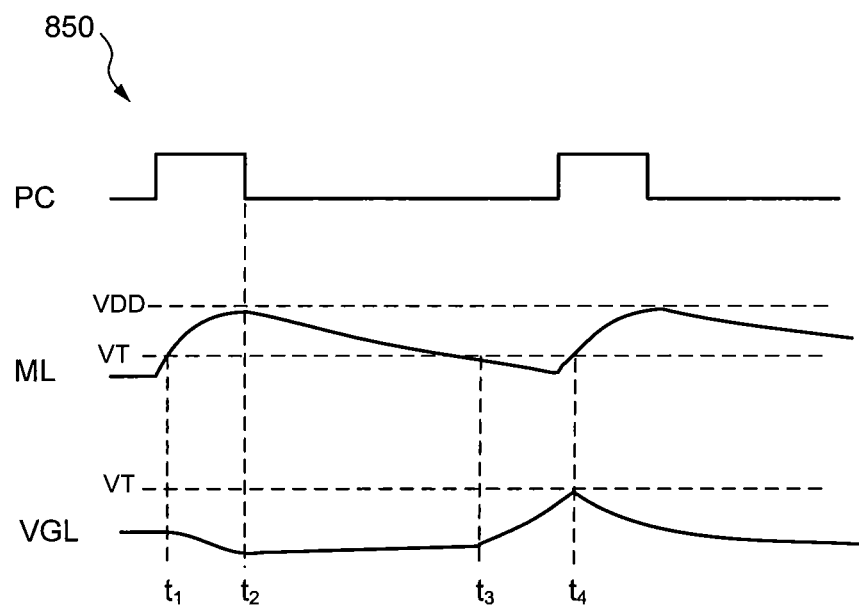
FIG. 8B is a timing diagram depicting a mismatch condition in the CAM row of FIG. 7.

FIG. 8B is a timing diagram 850 depicting various signal and line voltages corresponding to a mismatch condition in the embodiment of FIG. 7. The pre-charge phase is similar to that described above with respect to FIG. 8A. During the evaluation phase (e.g., between times $t_2$ and $t_4$), compare circuit 430 is conductive in response to the mismatch condition, and discharges the match line ML low towards ground potential. However, as the voltage on the match line ML falls below the threshold voltage (VT) of the discharge transistor 440 (at time $t_3$), discharge transistor 440 turns off and de-couples the VGL from ground potential, thereby preventing match line ML from completely discharging to ground potential. More specifically, because NMOS discharge transistor 440 turns off as the match line voltage falls below VT, embodiments of FIG. 7 effectively set a minimum match line voltage of approximately VT for mismatch conditions. As a result, match line ML can be pre-charged to its logic high state (e.g., towards VDD) for the next compare operation using less current than CAM row architectures of the type depicted in FIG. 1B.

Note that after time $t_3$, when NMOS discharge transistor 440 turns off and isolates the VGL from ground potential, the voltage on the VGL increases until assertion of the PC signal for the next compare operation (at time $t_4$). As a result, the match line voltage and the VGL voltage converge to a common value of approximately VT at the end of the evaluation phase of the compare operation. The time at which the match line voltage and the VGL voltage converge, as well as their common convergence voltage, depends in part upon the size and characteristics of discharge transistor 440. For example, increasing the size of transistor 440 improves the noise margin but also increases power consumption. Simulation results indicate that the embodiment of FIG. 7 improves power saving and noise margin with respect to the embodiment of FIG. 6A.

Figure 9:
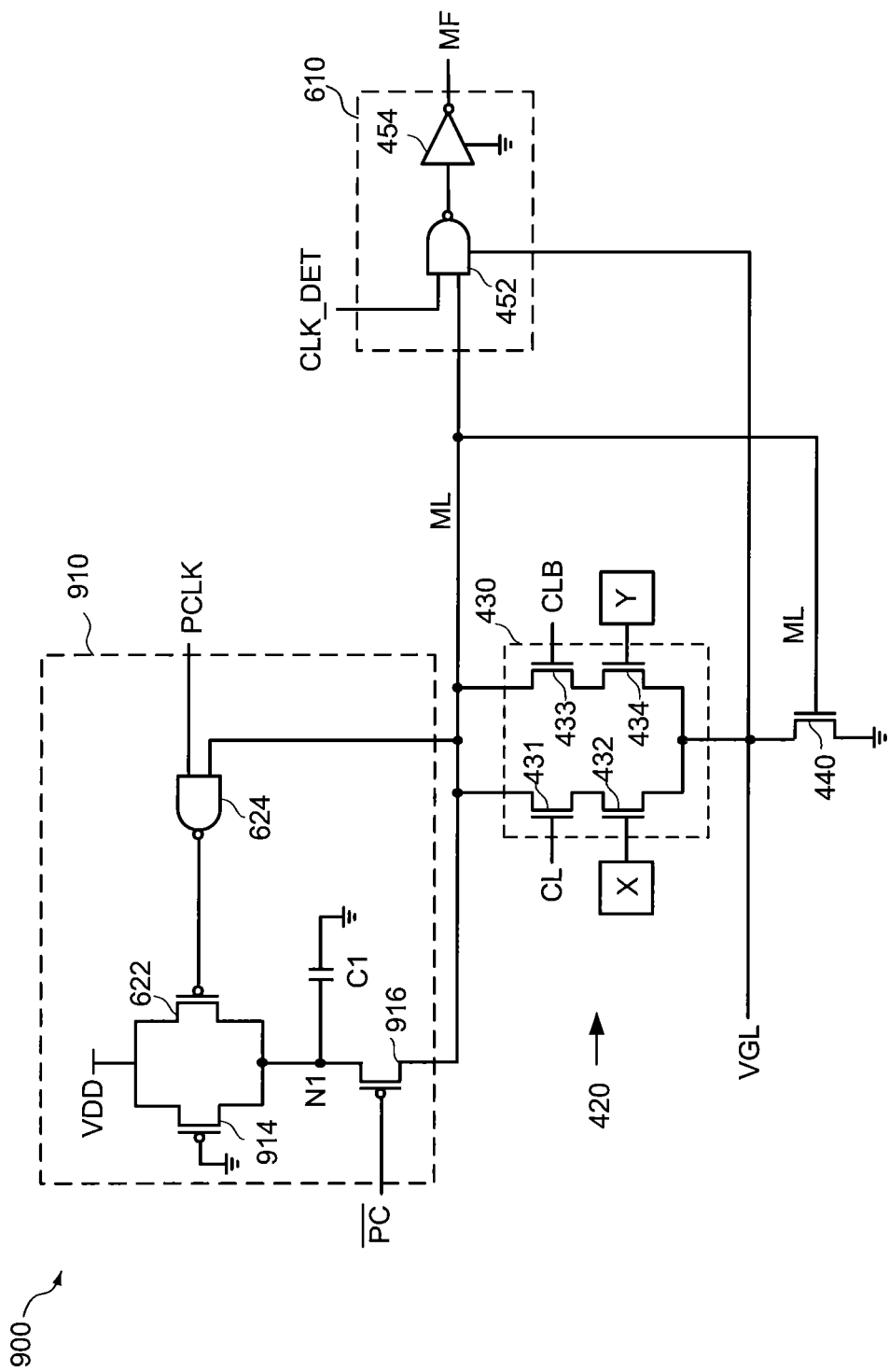
FIG. 9 is a circuit diagram of a CAM row including a CAM cell and a match line charging circuit configured in accordance with another embodiment.

FIG. 9 is a circuit diagram of a CAM row 900 in accordance with other embodiments that utilize charge sharing for match line ML. CAM row 900 is similar to CAM row 700 of FIG. 7, except that pre-charge transistor 410 is replaced by a match line charging circuit 910. As shown in FIG. 9, charging circuit 910 includes PMOS transistors 622, 914, and 916, NAND gate 624, and a tank capacitor C1. PMOS transistors 914 and 622 are connected in parallel between VDD and a charging node N1, with the gate of PMOS transistor 914 coupled to ground potential and the gate of PMOS transistor 622 coupled to the output of NAND gate 624. Thus, PMOS transistor 914 is maintained in a conductive state, and PMOS transistor 622 is responsive to a logical combination of the match signal on match line ML and PCLK (e.g., in a manner similar to that described above with respect to FIG. 6C).

A strong PMOS transistor 916 is connected between node N1 and match line ML, and is responsive to PC. Tank capacitor C1, which is connected between node N1 and ground potential, is continuously charged towards VDD by a weak PMOS transistor 914, and is also selectively charged towards VDD by PMOS transistor 622 (e.g., when PCLK is asserted high and match line ML is in its charged logic high state). For other embodiments, PMOS transistor 622 and NAND gate 624, which together form a match line keeper circuit, can be omitted.

During the pre-charge phase of the compare operation, PC is asserted to logic high (and thus $\overline{PC}$ is logic low), which turns on PMOS transistor 916 and thereby connects node N1 to match line ML. In response thereto, most of the charge stored on the tank capacitor C1 is shared with match line ML, thereby quickly charging match line ML high to a maximum level VDD/2 if the capacitance of match line ML and tank capacitor C1 are the same. The match line ML is also charged by the weak PMOS pull-up transistor 914, thereby increasing the voltage level of match line ML. Note that the voltage level of the charged match line ML can be controlled by adjusting the size and/or gate voltage of PMOS transistor 914. Also, note that during this pre-charge phase, the comparand lines CL and CLB need not be driven to the low logic state because the match line is being charged primarily through the tank capacitor C1 and not through a bulky PMOS transistor, which can reduce power consumption. This is in contrast to previous embodiments described above with respect to FIGS. 4, 6A, 6C, and 7.

Then, during the evaluation phase of the compare operation, PC is de-asserted to logic low (and thus $\overline{PC}$ is logic high) and turns off PMOS transistor 916, thereby isolating node N1 from match line ML. The tank capacitor C1 continues to be charged by the weak PMOS pull-up transistor 914 during the evaluation phase.

If there is a match condition, compare circuit 430 is non-conductive, thereby allowing match line ML to be charged to approximately VDD/2. As the match line voltage increases above the threshold voltage (Vtn) of transistor 440, NMOS discharge transistor 440 turns on and discharges the VGL to ground potential. The logic high state of match line ML also forces the output of NAND gate 624 to logic low, thereby turning on PMOS pull-up transistor 622 to further charge match line ML towards VDD. Conversely, if there is a mismatch condition, compare circuit 430 is conductive and discharges match line ML low towards the VGL. As the voltage on match line ML falls below the Vtn of discharge transistor 440, discharge transistor 440 turns off and de-couples the VGL from ground potential, thereby preventing match line ML from completely discharging to ground potential. Thus, the match line ML discharges to the VGL, which in turn experiences an increase in voltage to the Vt of transistor 440.

Figure 10:
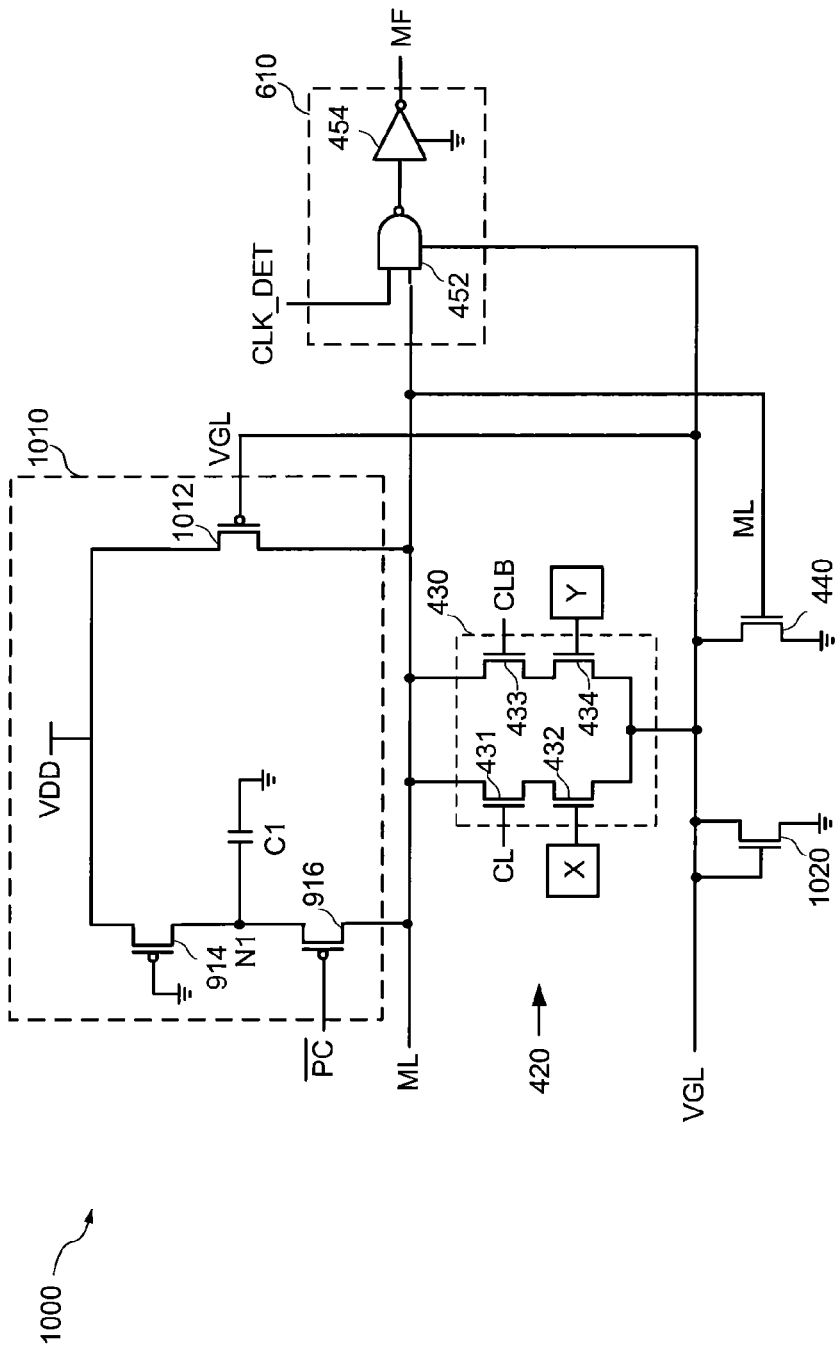
FIG. 10 is a circuit diagram of a CAM row including a CAM cell and a match line charging circuit configured in accordance with yet another embodiment.

FIG. 10 is a circuit diagram of a CAM row 1000 in accordance with other embodiments. CAM row 1000 is similar to CAM row 900 of FIG. 9, except that CAM row 1000 includes a match line charging circuit 1010 and a diode-connected NMOS transistor 1020. Diode-connected NMOS transistor 1020 is connected between the VGL and ground potential, and effectively clamps the VGL voltage at the VT of NMOS transistor 1020. Without diode 1020, the voltage on the VGL can reach undesirably high levels during mismatch conditions because, as discussed above with respect to FIG. 9, the VGL is charged by both the discharging match line ML and the tank capacitor C1 if there is a mismatch condition.

Charging circuit 1010 includes PMOS transistor 914, PMOS transistor 916, and tank capacitor C1 of FIG. 9, plus an additional PMOS pull-up transistor 1012 connected in parallel with PMOS transistors 914 and 916. More specifically, PMOS transistor 1012 is connected between VDD and match line ML, and has a gate connected to the VGL. In this manner, PMOS pull-up transistor 1012 turns on and charges match line ML high towards VDD sooner than does PMOS pull-up transistor 622 of FIG. 9, as described in more detail below.

More specifically, during the pre-charge phase of the compare operation, PC is asserted to logic high (and thus $\overline{PC}$ is logic low), which turns on PMOS transistor 916 and thereby connects node N1 to match line ML. In response thereto, most of the charge stored on the tank capacitor C1 is shared with match line ML, thereby quickly charging match line ML high towards VDD. The match line ML is also charged by the weak pull-up PMOS transistor 914, thereby increasing the voltage level of match line ML. Then, during the evaluation phase of the compare operation, PC is de-asserted to logic low and turns off PMOS transistor 916, thereby isolating node N1 from match line ML. The tank capacitor C1 continues to be charged by PMOS transistor 914 during the evaluation phase.

If there is a match condition, match line ML charges to approximately VDD/2 due to the charge from tank capacitor C1. The size of the weak PMOS transistor 914 is configurable to raise the voltage of match line ML even further to a desired level across various process corners. As the match line voltage exceeds the Vtn of transistor 440, NMOS discharge transistor 440 turns on and discharges the VGL to ground potential. As the VGL voltage falls below the Vtp of PMOS transistor 1012, PMOS transistor 1012 turns on and charges the match line ML higher towards VDD. The advantage of having this weak keeper circuit over the scheme of FIG. 9 is reduction in area and no crowbar current of NAND gate 624.

Conversely, if there is a mismatch condition, compare circuit 430 is conductive and discharges match line ML low towards the VGL. As the voltage on match line ML falls below the Vtn of discharge transistor 440, discharge transistor 440 turns off and de-couples the VGL from ground potential, thereby preventing match line ML from completely discharging to ground potential. Thus, the match line ML discharges to the VGL, which in turn experiences an increase in voltage not only from the discharging match line ML but also from the discharging of the tank capacitor. The increasing voltage on the VGL maintains PMOS pull-up transistor 1012 in a non-conductive state. As noted above, however, the VGL voltage is clamped at Vtn by diode-connected transistor 1020.

For actual embodiments of FIG. 10, leakage currents during compare idle times can inadvertently turn on the PMOS pull-up transistor 1012. For one example, following a mismatch condition in row 1000, the VGL will slowly discharge through diode 1020 and NMOS discharge transistor 440. The decreasing VGL voltage slowly turns on the PMOS pull-up transistor 1012, which in turn undesirably starts to charge the match line ML high towards VDD. For another example, following a match condition in row 1000, the PMOS pull-up transistor 1012 remains conductive and continues to charge the match line ML, even during idle cycles, which can undesirably increase power consumption.

Figure 11:
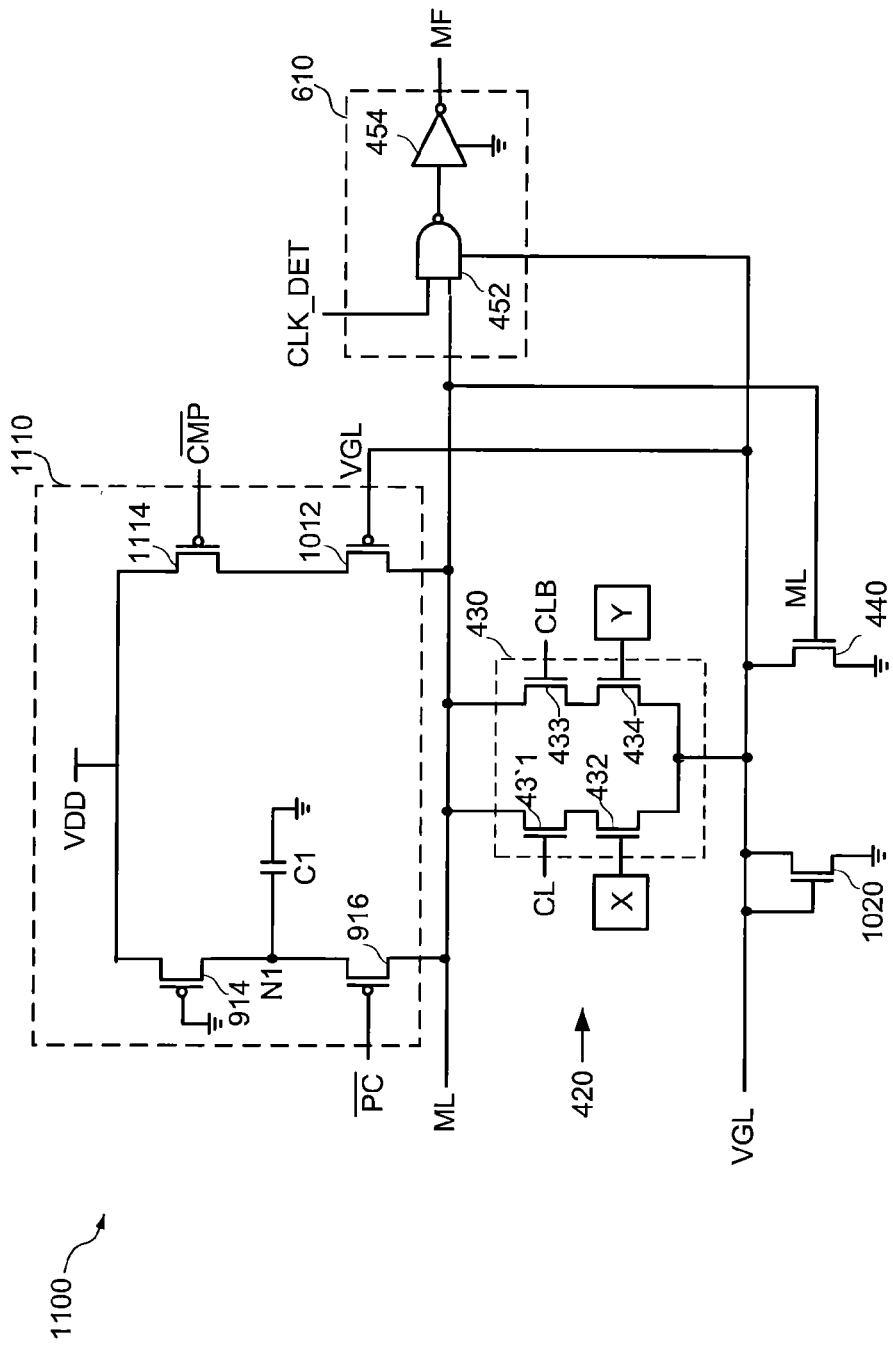
FIG. 11 is a circuit diagram of a CAM row including a CAM cell and a match line charging circuit configured in accordance with still another embodiment.

FIG. 11 is a circuit diagram of a CAM row 1100 configured to address leakage problems discussed above with respect to FIG. 10. CAM row 1100 is similar to CAM row 1000 of FIG. 10, except that CAM row 1100 includes a match line charging circuit 1110. Charging circuit 1110 is similar to charging circuit 1010 of FIG. 10, with the addition of a PMOS pull-up transistor 1114 connected in series between VDD and PMOS pull-up transistor 1012. The gate of PMOS pull-up transistor 1114 receives an active low compare signal $\overline{\text{CMP}}$ that is asserted to logic low only during the compare operation. Thus, during idle cycles, $\overline{\text{CMP}}$ is asserted to logic high to turn off PMOS pull-up transistor 1114, which reduces power consumption during the idle cycles.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Non-transitory computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device including an array having a plurality of rows, wherein a respective row from among the plurality of rows comprises:
   a plurality of CAM cells, each CAM cell from among the plurality of CAM cells being connected between a match line and a second line;
   a match line discharge transistor connected between the second line and a ground potential and having a gate responsive to a signal that selectively discharges the second line to the ground potential; and
   a match detect circuit having an input connected to the match line, a first power terminal connected to a supply voltage, and a second power terminal connected to the second line.

2. The CAM device of claim 1, wherein the match detect circuit comprises:
   a NAND gate connected between the supply voltage and the second line.

3. The CAM device of claim 1, wherein the gate of the match line discharge transistor is connected to the match line.

4. The CAM device of claim 1, wherein the gate of the match line discharge transistor is responsive to a pre-charge signal.

5. The CAM device of claim 1, wherein the respective row further comprises:
   a match line charging circuit comprising:
      a pre-charge transistor connected between the supply voltage and the match line and having a gate to receive a pre-charge signal;
      a PMOS pull-up transistor connected between the supply voltage and the match line and having a gate; and
      a NAND gate having a first input connected to the match line, a second input to receive a clock signal, and an output coupled to the gate of the PMOS pull-up transistor.

6. The CAM device of claim 1, wherein the respective row further comprises:
   a match line charging circuit comprising:
      a first PMOS transistor connected between the supply voltage and a charging node;
      a second PMOS transistor connected between the charging node and the match line; and
      a tank capacitor connected between the charging node and the ground potential.

7. The CAM device of claim 6, wherein the first PMOS transistor has a gate connected to the ground potential, and
   wherein the second PMOS transistor has a gate to receive a pre-charge signal.

8. The CAM device of claim 6, wherein the second PMOS transistor is configured to conduct and to allow the tank capacitor to charge the match line during a pre-charge phase of a compare operation.

9. The CAM device of claim 6, wherein the first PMOS transistor is configured to charge the tank capacitor during an evaluation phase of a compare operation, and
   wherein the second PMOS transistor is configured to be non-conductive and to isolate the charging node from the match line during the evaluation phase of the compare operation.

10. The CAM device of claim 6, wherein the match line charging circuit further comprises:
    a third PMOS transistor connected between the supply voltage and the charging node and having a gate; and
    a NAND gate having a first input connected to the match line, a second input to receive a control signal, and an output coupled to the gate of the third PMOS transistor.

11. The CAM device of claim 10, wherein the control signal is a clock signal.

12. The CAM device of claim 6, wherein the match line charging circuit further comprises:
    a third PMOS transistor connected between the supply voltage and the match line and having a gate connected to the second line.

13. The CAM device of claim 6, wherein the match line charging circuit further comprises:
    third and fourth PMOS transistors connected in series between the match line and the supply voltage,
    wherein the third PMOS transistor has a gate connected to the second line, and
    wherein the fourth PMOS transistor has a gate to receive a compare signal.

14. A row within a content addressable memory (CAM) device, the row comprising:
    a plurality of CAM cells, each CAM cell from among the plurality of CAM cells being connected between a match line and a second line;

a match line discharge transistor connected between the second line and a ground potential and having a gate connected to the match line, wherein the match line discharge transistor selectively discharges the second line to the ground potential;

a match detect circuit having an input connected to the match line, a first power terminal connected to a supply voltage, and a second power terminal connected to the second line; and a match line charging circuit comprising:
   a first PMOS transistor connected between the supply voltage and a charging node;
   a second PMOS transistor connected between the charging node and the match line; and
   a tank capacitor connected between the charging node and the ground potential.

15. The row of claim 14, wherein the first PMOS transistor has a gate connected to the ground potential, and
   wherein the second PMOS transistor has a gate to receive a pre-charge signal.

16. The row of claim 14, wherein the second PMOS transistor is configured to conduct and to allow the tank capacitor to charge the match line during a pre-charge phase of a compare operation.

17. The row of claim 14, wherein the first PMOS transistor is configured to charge the tank capacitor during an evaluation phase of a compare operation, and
   wherein the second PMOS transistor is configured to be non-conductive and to isolate the charging node from the match line during the evaluation phase of the compare operation.

18. The row of claim 14, wherein the match line charging circuit further comprises:
   a third PMOS transistor connected between the supply voltage and the charging node and having a gate; and
   a NAND gate having a first input connected to the match line, a second input to receive a control signal, and an output coupled to the gate of the third PMOS transistor.

19. The row of claim 18, wherein the control signal is a clock signal.

20. The row of claim 14, wherein the match line charging circuit further comprises:
   a third PMOS transistor connected between the supply voltage and the match line and having a gate connected to the second line.

21. The row of claim 14, wherein the match line charging circuit further comprises:
   third and fourth PMOS transistors connected in series between the match line and the supply voltage,
   wherein the third PMOS transistor has a gate connected to the second line, and
   wherein the fourth PMOS transistor has a gate to receive a compare signal.

22. The row of claim 14, wherein the match detect circuit comprises:
   a NAND gate connected between the supply voltage and the second line.

23. A content addressable memory (CAM) device including an array having a plurality of rows, wherein a respective row from among the plurality of rows comprises:
   a plurality of CAM cells, each CAM cell from among the plurality of CAM cells being connected between a match line and a second line;
   a match line discharge transistor connected between the second line and a ground potential and having a gate to receive a pre-charge signal; and a match detect circuit having an input connected to the match line, a first power terminal connected to a supply voltage, and a second power terminal connected to the second line, wherein the pre-charge signal is asserted during a pre-charge phase of a compare operation and is de-asserted during an evaluation phase of the compare operation.

24. The CAM device of claim 23, wherein the match detect circuit comprises:
   a NAND gate connected between the supply voltage and the second line.

25. The CAM device of claim 23, wherein the respective row further comprises:
   a match line charging circuit comprising:
      a pre-charge transistor connected between the supply voltage and the match line and having a gate to receive an inverse of the pre-charge signal;
      a PMOS pull-up transistor connected between the supply voltage and the match line and having a gate; and
      a NAND gate having a first input connected to the match line, a second input to receive a clock signal, and an output coupled to the gate of the PMOS pull-up transistor.

26. The CAM device of claim 23, wherein the respective row further comprises:
   a match line charging circuit comprising:
   a first PMOS transistor connected between the supply voltage and a charging node;
   a second PMOS transistor connected between the charging node and the match line; and
   a tank capacitor connected between the charging node and the ground potential.

27. The CAM device of claim 26, wherein the first PMOS transistor has a gate connected to the ground potential, and
   wherein the second PMOS transistor has a gate to receive the pre-charge signal.

28. The CAM device of claim 26, wherein the second PMOS transistor is configured to conduct and to allow the tank capacitor to charge the match line during the pre-charge phase of the compare operation.

29. The CAM device of claim 26, wherein the first PMOS transistor is configured to charge the tank capacitor during the evaluation phase of the compare operation, and
   wherein the second PMOS transistor is configured to be non-conductive and to isolate the charging node from the match line during the evaluation phase of the compare operation.

30. The CAM device of claim 26, wherein the match line charging circuit further comprises:
   a third PMOS transistor connected between the supply voltage and the charging node and having a gate; and
   a NAND gate having a first input connected to the match line, a second input to receive a control signal, and an output coupled to the gate of the third PMOS transistor.

31. The CAM device of claim 30, wherein the control signal is a clock signal.

32. The CAM device of claim 26, wherein the match line charging circuit further comprises:
   a third PMOS transistor connected between the supply voltage and the match line and having a gate connected to the second line.

33. The CAM device of claim 26, wherein the match line charging circuit further comprises:
   third and fourth PMOS transistors connected in series between the match line and the supply voltage,
   wherein the third PMOS transistor has a gate connected to the second line, and wherein the fourth PMOS transistor has a gate to receive a compare signal.

34. The row of claim 14, wherein the match line discharge transistor is configured to discharge the second line to the ground potential during a pre-charge phase of a compare operation and to disconnect the second line from the ground potential during an evaluation phase of the compare operation.

35. The CAM device of claim 23, wherein the match line discharge transistor is configured to discharge the second line to the ground potential during the pre-charge phase of the compare operation based on the asserted pre-charge signal and to disconnect the second line from the ground potential during the evaluation phase of the compare operation based on the de-asserted pre-charge signal.

* * * * *